United States Patent
Cummings

(10) Patent No.: US 7,345,738 B2
(45) Date of Patent: Mar. 18, 2008

(54) CERTIFIED CELLS AND METHOD OF USING CERTIFIED CELLS FOR FABRICATING A DEVICE

(75) Inventor: Kevin David Cummings, Phoenix, AZ (US)

(73) Assignee: ASML Netherlands B.V., Veldhoven (NL)

( * ) Notice: Subject to any disclaimer, the term of this patent is extended or adjusted under 35 U.S.C. 154(b) by 216 days.

(21) Appl. No.: 11/002,459

(22) Filed: Dec. 3, 2004

(65) Prior Publication Data

US 2006/0119814 A1  Jun. 8, 2006

(51) Int. Cl.
*G03B 27/42* (2006.01)
(52) U.S. Cl. .............................. 355/53; 355/75; 716/21
(58) Field of Classification Search ................. 355/53, 355/46, 75, 7; 430/5, 30; 716/10, 19–21
See application file for complete search history.

(56) References Cited

U.S. PATENT DOCUMENTS

| | | | |
|---|---|---|---|
| 4,613,940 A | | 9/1986 | Shenton et al. |
| 5,849,436 A | * | 12/1998 | Yamada et al. ............... 430/5 |
| 6,539,531 B2 | | 3/2003 | Miller et al. |
| 6,546,544 B1 | | 4/2003 | Kawakami |
| 6,665,846 B2 | | 12/2003 | Rein et al. |
| 6,748,578 B2 | | 6/2004 | Cobb |
| 6,773,983 B2 | | 8/2004 | Richter et al. |
| 2002/0028398 A1 | * | 3/2002 | Ogino ........................ 430/30 |
| 2002/0160281 A1 | * | 10/2002 | Subramanian et al. ......... 430/5 |

* cited by examiner

*Primary Examiner*—D. Rutledge
(74) *Attorney, Agent, or Firm*—Pillsbury Winthrop Shaw Pittman LLP

(57) ABSTRACT

A method of using a cell library to create a device, includes projecting a series of masks, each mask of the series corresponding to a layer of each of one or more selected cells, onto a substrate according to a data layout of the device or combining a series of masks, each mask of the series corresponding to a layer of one or more of the selected cells, into a series of global masks, each of global masks of the series of global masks embodying a layer of the device according to a data layout of the device.

46 Claims, 4 Drawing Sheets

CERTIFIED CELLS AND METHOD OF USING CERTIFIED CELLS FOR FABRICATING A DEVICE

FIELD

The present invention relates to lithographic systems and in particular to a method of using a cell library to create a pattern on a mask or a substrate.

BACKGROUND

A lithographic apparatus is a machine that applies a desired pattern onto a target portion of a substrate. Lithographic apparatus can be used, for example, in the manufacture of integrated circuits (ICs). In that circumstance, a patterning device, which is alternatively referred to as a mask or a reticle, may be used to generate a circuit pattern corresponding to an individual layer of the IC, and this pattern can be imaged onto a target portion (e.g. comprising part of, one or several dies) on a substrate (e.g. a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion at one time, and so-called scanners, in which each target portion is irradiated by scanning the pattern through the projection beam in a given direction (the "scanning"-direction) while synchronously scanning the substrate parallel or anti-parallel to this direction.

The concept of a mask is well known in lithography, and it includes mask types such as binary, alternating phase shift, and attenuated phase shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired.

Another example of a patterning device is a programmable mirror array. One example of such an array is a matrix-addressable surface having a viscoelastic control layer and a reflective surface. The basic principle behind such an apparatus is that, for example, addressed areas of the reflective surface reflect incident light as diffracted light, whereas unaddressed areas reflect incident light as undiffracted light. Using an appropriate filter, the undiffracted light can be filtered out of the reflected beam, leaving only the diffracted light behind. In this manner, the beam becomes patterned according to the addressing pattern of the matrix addressable surface.

In current apparatus, employing patterning by a mask on a mask table, a distinction can be made between two different types of machine. In one type of lithographic projection apparatus, each target portion is irradiated by exposing the entire mask pattern onto the target portion at once. Such an apparatus is commonly referred to as a stepper. In an alternative apparatus, commonly referred to as a step and scan apparatus, each target portion is irradiated by progressively scanning the mask pattern under the projection beam in a given reference direction (the "scanning" direction) while synchronously scanning the substrate table parallel or anti-parallel to this direction. Since, in general, the projection system will have a magnification factor M (generally <1), the speed V at which the substrate table is scanned will be a factor M times that at which the mask table is scanned. More information with regard to lithographic devices as here described can be seen, for example, from U.S. Pat. No. 6,046,792.

In a known manufacturing process using a lithographic projection apparatus, a pattern (e.g. in a mask) is imaged onto a substrate that is at least partially covered by a layer of radiation sensitive material (resist). Prior to this imaging, the substrate may undergo various procedures, such as priming, resist coating and a soft bake. After exposure, the substrate may be subjected to other procedures, such as a post-exposure bake (PEB), development, a hard bake and measurement and/or inspection of the imaged features. This array of procedures may be used as a basis to pattern an individual layer of a device, e.g. an IC. Such a patterned layer may then undergo various processes such as etching, ion-implantation (doping), metallization, oxidation, chemical, mechanical polishing, etc., all intended to finish off an individual layer.

If several layers are required, then it may be necessary to repeat the whole procedure, or a variant or portion thereof, for each new layer, with the overlay (juxtaposition) of the various stacked layers being performed as accurately as possible. For such purpose, a small reference mark is provided typically at one or more positions on the substrate, thus defining the origin of a coordinate system on the substrate. Using, for example, optical and electronic devices in combination with the substrate holder positioning device (referred to hereinafter as "alignment system"), this mark can then be relocated each time a new layer has to be juxtaposed on an existing layer, and can be used as an alignment reference. Eventually, an array of devices may be present on the substrate (wafer). These devices may then separated from one another by a technique such as dicing or sawing, whence individual devices may be mounted on a carrier, connected to pins, etc. Further information regarding such processes can be obtained, for example, from the book "Microchip Fabrication: A Practical Guide to Semiconductor Processing," Third Edition, by Peter van Zant, McGraw Hill Publishing Co., 1997, ISBN 0-07-067250-4.

In designing a device such as an integrated circuit (IC), the basic elements for circuit design called cells are combined to form the device. In a logic circuit, for example, the cells are in inverter, an AND gate, a NAND gate, an OR gate, a NOR gate, an EXOR gate, an EXNOR gate, a flip-flop and a selector or multiplexer. In an analog circuit, for example, the cells are an amplifier, a comparator, an analog-to-digital converter (A/D converter), a digital-to-analog converter (D/A converter). In a memory circuit, for example, the cells are a memory cell such as an elementary memory RS flip-flop, a sense amplifier and a decoder. In a central processing unit (CPU) core circuit or a microprocessing unit (MPU), for example, the cells are a register, input-output (I/O) blocks and an arithmetic logic unit (ALU). However, cells may also be defined as higher level cells which can be made of blocks of elementary cells such as, for example, inverters, AND, NAND, NOR gates, etc. For example, cells can be defined as being CPUs, MPUs, or memories which, as discussed above, are a combination of elementary cells. Cells can even be defined as constituting large portions of a device, such as an integrated circuit.

FIG. 4 is a flow chart showing the various steps of a conventional method 400 for fabricating a device, such as an IC. The cells are designed by taking into account design rules restraints, strategy, device performance and the exposure system. The cells are stored in a cell library 410. To design a desired device 412, selected cells are retrieved from the cell library and a wiring is laid between the selected cells to form a data layout 414. The cell library is used repeatedly for designing several types of data layout. A same cell may be used for various device data layouts.

One or more computer programs are used to create a data layout of individual devices, i.e., cells, coupled together to perform a certain function. In order to fabricate the device, the circuit is typically translated into a physical representation, or layout. For example, computer aided design (CAD) tools can assist layout designers in the task of translating the discrete circuit elements or cells into configurations or shapes which will embody the devices themselves in the completed circuit. The result is a composite picture or "blueprint" of the circuit surface showing all the sublayer patterns. The shapes produce the individual components of the circuit, such as gate electrodes, field oxidation regions, diffusion regions, metal interconnections, and so on.

To illustrate an example of a data layout, a simplified "imaginary" data layout 414 is represented in FIG. 4 in which cell A (represented by a circle), cell B (represented by a square), cell C (represented by a triangle) are connected to each other and in which cell B is connected to another cell A. For example, this data layout can be for a graphic accelerator or a digital signal processor (DSP) which can use a memory, a MPU and I/O blocks.

Once the layout of the circuit has been created, the layout is transferred to a physical template in which a mask is generally created in the mask fabrication process 416 for each layer of the circuit design. In this way, a set of masks 418 are created from the circuit data layout 414. Each mask created for each layer of the circuit design may comprise a plurality of different cells of the library of cells. The layers of a circuit represent the various fabrication steps or levels that are sequenced to form three dimensional regions (semiconductors regions) and interconnects (metal lines) that form the device circuit. For example, as illustrated in FIG. 1, the set of masks 418 comprises four masks (M1, M2, M3 and M4). Each mask (M1, M2, M3 and M4) corresponds to an individual layer of the circuit design.

The transfer of the layout to a physical template is performed by inputting the data representing the layout design 414 for that layer into a device such as an electron beam machine which writes the circuit layout pattern into the corresponding mask material. In less complicated and dense circuits, each mask comprises the geometric shapes which represent the desired circuit pattern for its corresponding layer. In more complicated and dense circuits in which the size of the circuit features approach the optical limits of the lithography process, the masks may also comprise optical proximity correction features, such as serifs, hammerheads, bias and assist bars, which are sublithographic sized features designed to compensate for proximity effects. In other advanced circuit designs, phase shifting masks may be used to circumvent certain basic optical limitations of the process by enhancing the contrast of the optical lithography process.

As circuit designs become more complicated, it becomes increasingly important that the masks used in photolithography are accurate representations of the original design layout. However, due to inaccuracies, design errors and compromises during the creation of the layout and the fabrication of the masks, the circuit fabricated according to the layout may not reflect the properties of the circuit designed. In the case of sub-micron ICs, designers increasingly rely on electronic design automation (EDA) tools to assist them in designing ICs and to make the necessary corrections to the various geometries of an IC mask layout to achieve the desired sub-micron IC images as the critical dimension (CD) becomes smaller. In order to ensure that the fabricated circuit functions according to the circuit design, the data layout is subjected to verification by testing each mask after fabrication with a mask testing procedure 420. For example, if a specific mask corresponding to a specific layer of the design is found to have errors, the mask is sent back to mask fabrication 416 where appropriate corrections to the mask can be implemented.

Even though the cells in the cell library 410 may be verified and tested, the layout design 414 once transferred into a physical representation in a form of set of masks 418 may include inaccuracies or errors because the steps following the creation of the layout design 414 on a computer, such as during the fabrication of the masks M1, M2, M3 and M4, are all unique. In addition, even though the same verified and tested cells from the cell library are used numerous times to create a design layout (for example cell A in the layout 414 is used twice), errors may still be present once the masks are fabricated. As a result, repeated verification of the same cell structures or blocks of patterns in the layout design may be necessary to ensure that the fabricated circuit functions according to the circuit design. This can be tedious and time consuming as each cell in each level of the layout design, i.e., in each mask M1, M2, M3 and M4, is verified and tested repeatedly. For example, cell A in each mask M1, M2, M3 and M4 corresponding to each level of the layout 414, should be verified twice because the cell A is used twice in the design layout 414.

The masks that are verified and found to be within production specifications are then used, for example, to optically project each mask M1, M2, M3 and M4 onto a substrate coated with a photoresist material in an exposure and projection process 422. For each layer of the design layout 414, radiation is used to project the features in the mask corresponding to that layer. As discussed above, the exposed photoresist layer is then developed, typically through chemical removal of the exposed/non-exposed regions of the photoresist layer. The end result is a semiconductor substrate coated with a photoresist layer exhibiting a desired pattern which defines the geometries, features, lines and shapes of that layer. This process is repeated for each layer of the design. An array of devices is obtained on the substrate. These devices are then separated from one another by a technique such as dicing or sawing in the process of device fabrication 424. The individual devices can then be mounted on a carrier, connected to pins, etc.

SUMMARY

According to an aspect of the invention, there is provided a method of using a cell library to create a device. A design of the device includes a data layout of the device formed from one or more selected cells from the cell library. The method comprises projecting a series of masks, each mask of the series corresponding to a layer of each of the one or more selected cells, onto a substrate according to the data layout of the device. The substrate can be, for example, a semiconductor substrate.

A selected cell may comprise an elementary cell. The elementary cell may include, for example, a basic element of a layout of an integrated circuit device. The selected cell may also comprise a block of elementary cells or a portion of a data layout of an integrated circuit device.

The method may further comprise selecting one or more desired cells from a cell library and designing the device by wiring the one or more selected cells to form the data layout of the device.

In the method according to an embodiment of the present invention, the design of the device is performed using a computer program. The design of the device comprises, for example, coupling the one or more selected cells to form the data layout of the device.

According to one embodiment of the invention, the method may also include fabricating the series of masks and may also include testing the series of masks, prior to projecting the series of masks onto the substrate. The layers of a selected cell comprise fabrication steps sequenced to form a three dimensional region of the selected cell.

In an embodiment of the invention, the series of masks include a first series of masks corresponding to layers of a first selected cell and a second series of masks corresponding to a second selected cell. The projection of the series of masks includes projecting the first series of masks corresponding to layers of the first selected cell onto a first location on the substrate and projecting the second series of masks corresponding to layers of the second selected cell onto a second location on the substrate. The first location and the second location are spatially shifted from each other in accordance with the data layout of the device. The first series of masks may comprise first and second masks and the second series of masks may comprise first and second masks. The first and second masks of the first series of masks are created based on a data layout of the first cell and the first and second masks of the second series of masks are created based on a data layout of the second cell.

In one embodiment of the invention, the first series of masks comprises first and second masks and the second series of masks comprises first and second masks and projecting the series of masks onto the substrate includes projecting the first mask of the first series of masks onto a first location on the substrate and projecting the first mask of the second series of masks onto a second location on the substrate to form at least in part a first layer of the device. The projecting of the series of masks corresponding to layers of the selected cells onto the substrate may further include projecting the second mask of the first series of masks onto the first location on the substrate and projecting the second mask of the second series of masks onto the second location on the substrate to form at least in part a second layer of the device.

In an embodiment of the invention, the projection of the series of masks corresponding to layers of the selected cells onto a substrate is performed using a lithographic apparatus.

In an embodiment of the invention, the method further includes projecting a wiring pattern to wire a layer of a first selected cell and a layer of a second selected cell. The projecting the wiring pattern can be performed using, for example, a direct write lithography method.

Another aspect of the present invention is to provide a method of using a cell library to make a device. A design of the device includes a data layout of the device formed from one or more selected cells from the cell library. The method comprises combining a series of masks, each mask of the series of masks corresponding to a layer of each of the one or more selected cells, into a series of global masks, each of the global masks of the series of global masks embodying a layer of the device according to the data layout of the device.

The method may further comprise selecting one or more desired cells from a cell library and designing the device by wiring the one or more selected cells to form the data layout of the device.

In an embodiment of the invention, the method may further include fabricating the series of masks and may further include testing the series of masks corresponding to layers of the selected cells, prior to combining the series of masks into the series of global masks.

In an embodiment of the invention, the series of masks include a first series of masks corresponding to layers of a first selected cell and a second series of masks corresponding to a layer of a second selected cell. The first series of masks may comprise first and second masks and the second series of masks may comprise first and second masks. The series of global masks may comprise first and second global masks.

According to an embodiment of the invention, combining the series of masks into a series of global masks may include combining the first mask of the first series of masks and the first mask of the second series of masks into the first global mask and combining the second mask of the first series of masks and the second mask of the second series of masks into the second global mask.

In an embodiment of the invention, the method may further include projecting the first global mask and the second global mask of the series of global masks onto a substrate to form the device.

Yet another aspect of the present invention is to provide a lithographic apparatus. The lithographic apparatus comprises an illuminator adapted to condition a beam of radiation and a support structure configured to hold a patterning device, the patterning device configured to impart the beam with a pattern in its cross-section. The patterning device comprises a series of masks corresponding to layers of one or more selected cells, a data layout of a device formed from the one or more selected cells. The lithographic apparatus also includes a substrate table configured to hold a substrate and a projection system adapted to project the patterned beam onto a target portion of the substrate. When used, the series of masks are projected onto the substrate according to the data layout. The one or more selected cells may include a basic element of the data layout of the device. The device can be, for example, an integrated circuit device. The substrate can be, for example, a mask blank.

In an embodiment of the invention, each mask in the series of masks is offset in at least one direction relative to another mask in the series of masks.

In an embodiment of the invention, the lithographic apparatus further includes a direct write lithographic system adapted to project a wiring pattern to wire a layer of a first selected cell and a layer of a second selected cell. The direct write lithographic system can be, for example, an e-beam lithography apparatus.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5-20 nm), as well as particle beams, such as ion beams or electron beams.

The term "patterning device" used herein should be broadly interpreted as referring to any device that can be used to impart a beam with a pattern in its cross-section such as to create a pattern in a target portion of the substrate. It should be noted that the pattern imparted to the beam may not exactly correspond to the desired pattern in the target portion of the substrate. Generally, the pattern imparted to the beam will correspond to a particular functional layer in a device being created in the target portion, such as an integrated circuit.

A patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned.

The support structure holds the patterning device in a way depending on the orientation of the patterning device, the design of the lithographic apparatus, and other conditions, such as for example whether or not the patterning device is held in a vacuum environment. The support can use mechanical clamping, vacuum, or other clamping techniques, for example electrostatic clamping under vacuum conditions. The support structure may be a frame or a table, for example, which may be fixed or movable as required and which may ensure that the patterning device is at a desired position, for example with respect to the projection system. Any use of the terms "reticle" or "mask" herein may be considered synonymous with the more general term "patterning device."

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "projection lens" herein may be considered as synonymous with the more general term "projection system."

The illumination system may also encompass various types of optical components, including refractive, reflective, and catadioptric optical components for directing, shaping, or controlling the beam of radiation, and such components may be referred to below, collectively or singularly, as a "lens."

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein a surface of the substrate is immersed in a liquid having a relatively high refractive index, e.g. water, so as to fill a space between a final element of the projection system and the substrate. Immersion liquids may also be applied to other spaces in the lithographic apparatus, for example, between the mask and a first element of the projection system. Immersion techniques are well known in the art for increasing the numerical aperture of projection systems.

The methods described herein may be implemented as software, hardware or a combination. In an embodiment, there is provided a computer program comprising program code that, when executed on a computer system, instructs the computer system to perform any or all of the methods described herein.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
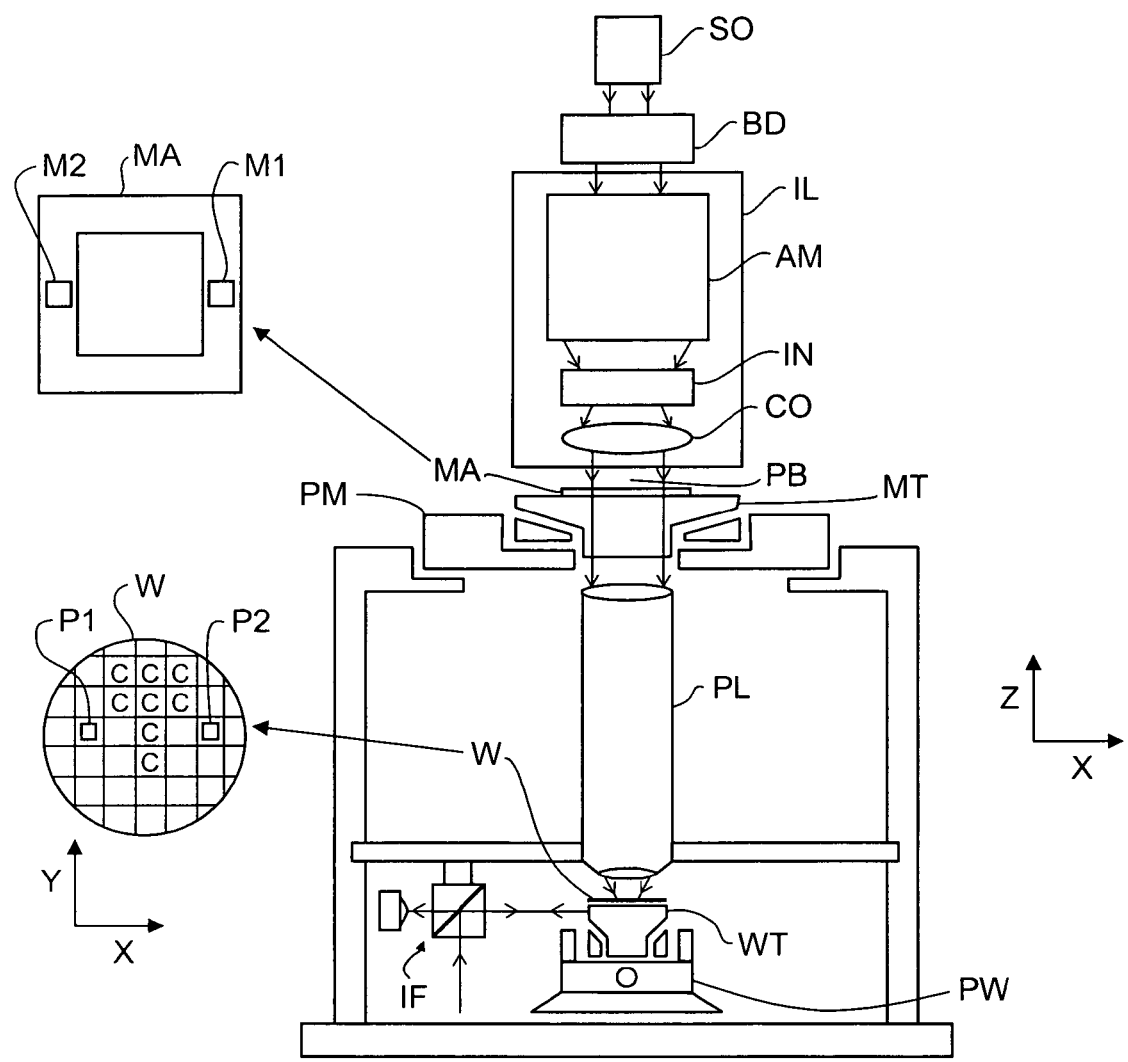
FIG. 1 depicts a lithographic apparatus according to an embodiment of the invention.

FIG. 1 schematically depicts a lithographic apparatus according to a particular embodiment of the invention. The apparatus comprises an illumination system (illuminator) IL adapted to condition a beam PB of radiation (e.g. UV radiation). The apparatus also comprises a support structure (e.g. a mask table) MT configured to hold a patterning device (e.g. a mask) MA and connected to first positioning device PM configured to accurately position the patterning device with respect to item PL.

The apparatus also comprises a substrate table (e.g. a wafer table) WT configured to hold a substrate (e.g. a resist-coated wafer) W and connected to second positioning device PW configured to accurately position the substrate with respect to item PL.

The apparatus also comprises a projection system (e.g. a refractive projection lens) PL adapted to image a pattern imparted to the beam PB by the patterning device MA onto a target portion C (e.g. comprising one or more dies) of the substrate W.

As here depicted, the apparatus is of a transmissive type (e.g. employing a transmissive mask). Alternatively, the apparatus may be of a reflective type (e.g. employing a programmable mirror array of a type as referred to above).

The illuminator IL receives a beam of radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising for example suitable directing mirrors and/or a beam expander. In other cases the source may be integral part of the apparatus, for example when the source is a mercury lamp. The source SO and the illuminator IL, together with the beam delivery system BD if required, may be referred to as a radiation system.

The illuminator IL may comprise an adjusting device AM for adjusting the angular intensity distribution of the beam. Generally, at least the outer and/or inner radial extent (commonly referred to as σ-outer and σ-inner, respectively) of the intensity distribution in a pupil plane of the illuminator can be adjusted. In addition, the illuminator IL generally comprises various other components, such as an integrator IN and a condenser CO. The illuminator provides a conditioned beam of radiation, referred to as the projection beam PB, having a desired uniformity and intensity distribution in its cross-section.

The projection beam PB is incident on the mask MA, which is held on the mask table MT. Having traversed the mask MA, the projection beam PB passes through the projection system PL, which focuses the beam onto a target portion C of the substrate W. With the aid of the second positioning device PW and position sensor IF (e.g. an interferometric device), the substrate table WT can be moved accurately, e.g. so as to position different target portions C in the path of the beam PB. Similarly, the first positioning device PM and another position sensor (which is not explicitly depicted in FIG. 1) can be used to accurately position the mask MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the one or both of the positioning devices PM and PW. However, in the case of a stepper (as opposed to a scanner) the mask table MT may be connected to a short stroke actuator only, or may be fixed. Mask MA and substrate W may be aligned using mask alignment marks M1, M2 and substrate alignment marks P1, P2.

The depicted apparatus can be used in the following preferred modes:

1. In step mode, the mask table MT and the substrate table WT are kept essentially stationary, while an entire pattern imparted to the projection beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the projection beam is projected onto a target portion C (i.e. a single dynamic exposure). The velocity and direction of the substrate table WT relative to the mask table MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the projection beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes a programmable patterning device, such as a programmable mirror array of a type as referred to above.

Combinations and/or variations on the above described modes of use or entirely different modes of use may also be employed.

Figure 2:
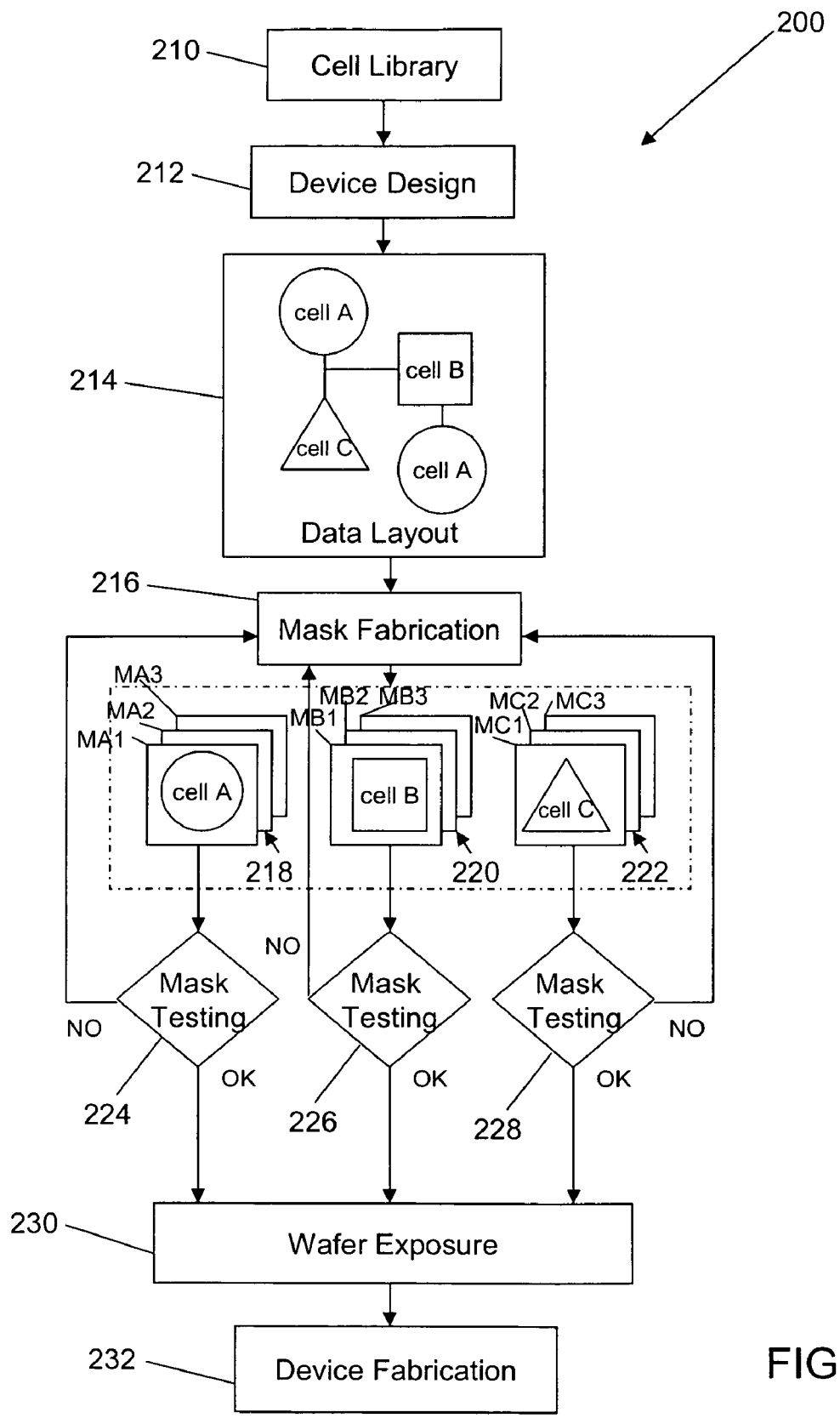
FIG. 2 is a flow chart showing the various steps in a process for the fabrication of a device according to an embodiment of the invention.

FIG. 2 is a flow chart 200 showing the various steps in a process for making a mask and fabricating a device according to an embodiment of the present invention. To design a desired device 212, selected cells are retrieved from a cell library 210 and a wiring is laid between the selected cells to form a device data layout 214 in a computer. The cell library 210 is used repeatedly for designing several types of device data layout. A same cell may be used for various device data layouts.

One or more computer programs are used to create the device data layout comprising individual cells coupled together to perform a certain function. For example, a computer aided design (CAD) tool can assist layout designers in the task of translating discrete circuit elements or cells into configurations or shapes which will be embodied in the completed device. The shapes produce the individual components of the circuit elements, such as gate electrodes, field oxidation regions, diffusion regions, metal interconnections, etc.

Figure 4:
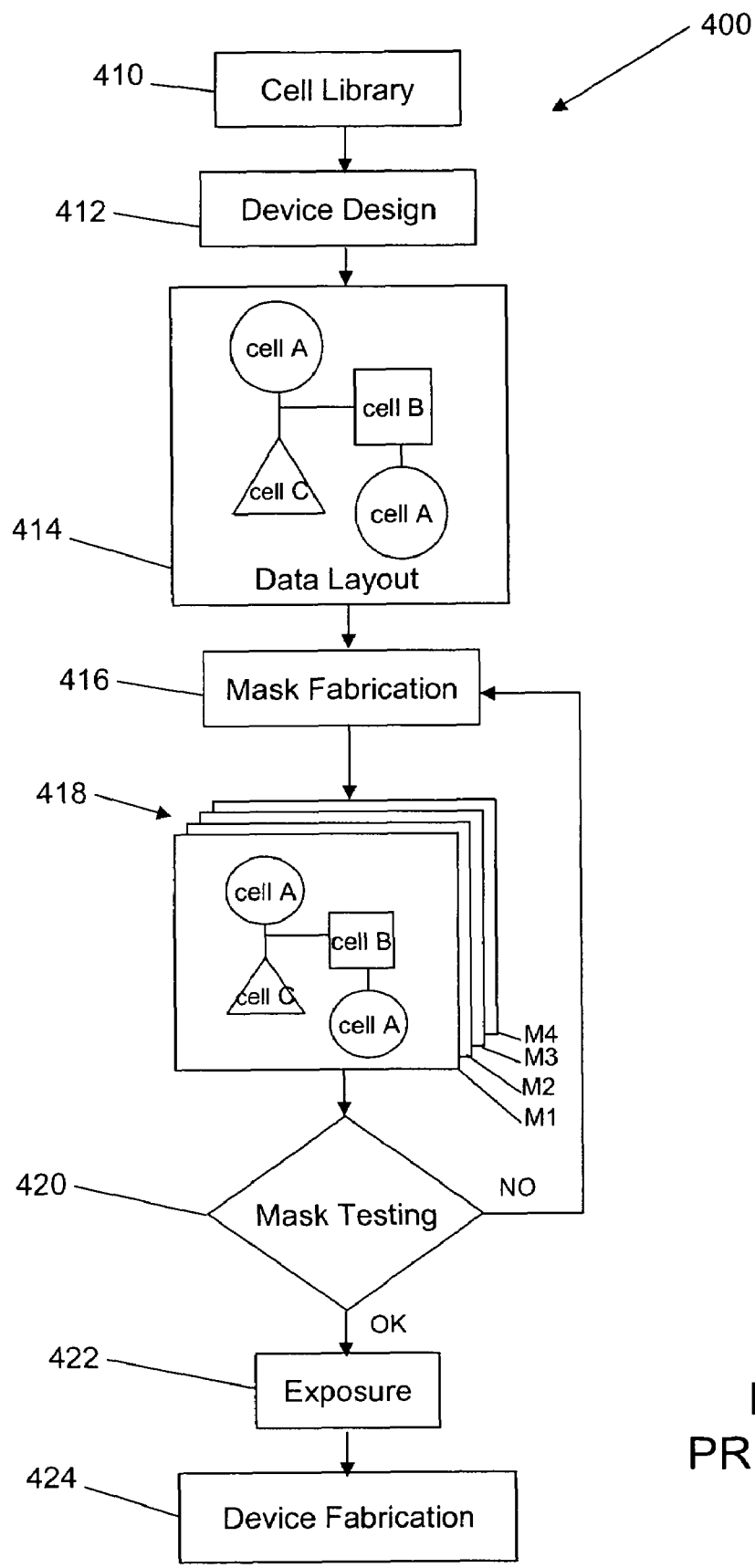
FIG. 4 is a flow chart showing the various steps in the fabrication of device according to a conventional process.

Contrary to a conventional process shown in FIG. 4 in which the device data layout formed of interconnected cells is converted into a physical template for which a mask is generally created for each layer of the device design, in the process according to an embodiment of the present invention, one or more masks are created for each cell that is used in the device data layout. This will be described in more detail in the following paragraphs.

For example, a series of masks 218 corresponding to a series of layers for cell A (represented schematically by a circle) are created with mask fabrication process 216. Similarly, a series of masks 220 corresponding to a series of layers for cell B (represented schematically by a square) are created using mask fabrication process 216. Similarly, a series of masks 222 corresponding to a series of layers for cell C (represented schematically by a triangle) are created using mask fabrication process 216.

The one or more layers of a cell represent the various fabrication steps or levels that are sequenced to form three dimensional regions (semiconductors regions) and interconnects (metal lines) that form the cell "circuit." For example, the set of masks 218 comprises three masks MA1, MA2 and MA3. The three masks MA1, MA2 and MA3 are created based on the data layout of cell A. Similarly, the set of masks 220 comprises three masks MB1, MB2 and MB3. The three masks MB1, MB2 and MB3 are created based on the data layout of cell B. Similarly, the set of masks 222 comprise three masks MC1, MC2 and MC3. The three masks are created based on the data layout of cell C. Each mask MA1, MA2, MA3, MB1, MB2, MB3, MC1, MC2 and MC3 corresponds to an individual layer of the respective cell A, cell B or cell C.

The transfer of a cell layout to a physical template is performed by inputting the data representing the layout of each cell for that layer into a device such as an electron beam machine which writes the layout pattern of the cell into the corresponding mask material. Each mask comprises the geometric shapes which represent the cell pattern for its corresponding cell layer.

As device designs become more complicated, it becomes increasingly important that the masks used in lithography are accurate representations of the original design layout. However, due to inaccuracies, design errors and compromises during the fabrication of a mask, the cell "circuit" fabricated according to the cell layout may not reflect the properties of the cell. Thus, in order to ensure that the fabricated cell "circuit" functions according to the cell of the cell library, each set of masks for each cell may be tested.

For example, the series of masks MA1, MA2 and MA3 can be tested with mask test procedure 224, the series of masks MB1, MB2 and MB3 can be tested with mask test procedure 226 and the series of masks MC1, MC2 and MC3 can be tested with mask test procedure 228. If a specific mask corresponding to a specific layer of one cell (e.g., cell A, cell B or cell C) is found to have errors, the mask is sent back to mask fabrication 216 so that appropriate correction to the mask can be implemented.

The set of masks 218, 220 and 222 of respectively cell A, cell B and cell C once tested are certified and do not need to be retested again before another use. In this way, a certified library of cell-masks is built. Hence, if a need arises for the use of a specific cell in a device design, a corresponding set of certified masks can be retrieved from the library of cell-masks. In this respect, if desired cell-masks are already available in a library of cell-masks, i.e. "off the shelf," the step of fabricating the set of masks for each needed cell can be eliminated. This may translates into time saving as well as cost saving in the overall device fabrication process. Furthermore, by providing "off-the-shelf" series of masks (e.g., MA, MA2, MA3, MB1, MB2, MB2, MC1, MC2, MC3) corresponding to layers of selected cells (cell A, cell B, cell C) and projecting the series of masks to form the various layers of the device, the process for fabricating the device may be rendered more flexible.

The set of masks 218, 220 and 222 are then used to optically project the layout of each cell (cell A, cell B and cell C) onto a substrate coated with resist material in the exposure process 230. The set of masks 218, 220 and 222 are projected on the substrate at designated locations but shifted relative to each other to form the device design directly on the substrate. In an embodiment, radiation is used to project the features in masks MA1, MB1 and MC1 corresponding to a first layer of, respectively, cell A, cell B and cell C onto the substrate to form a first layer of the device on the substrate. This process is followed by projecting the features in masks MA2, MB2 and MC2 corresponding to a second layer of, respectively, cell A, cell B and cell C onto the substrate to form a second layer on top of the first layer of the device on the substrate. Finally, projecting the features in masks MA3, MB3 and MC3 corresponding to a second layer of, respectively, cell A, cell B and cell C onto the substrate to form a third layer on top of the second layer of the device on the substrate.

In another embodiment, the series of masks MA1, MA2 and MA3 are sequentially projected onto a substrate at a first location to build the first, second and third layers of cell A on top of each other. The series of masks MB1, MB2 and MB3 are then sequentially projected onto the substrate at a second location shifted relative to the first location to build the first, second and third layers of cell B on top of each other. Finally, the series of masks MC1, MC2 and MC3 are sequentially projected onto the substrate at a third location shifted relative to the first and second locations to build the first, second and third layers of cell C on top of each other.

In an embodiment, one way to implement the shifting of the masks (A1, MA2, MA3, MB1, MB2, MB3, MC1, MC2 and MC3) relative to each other is to mount two or more of the masks on a mask table in a lithographic apparatus with a variable offset in X and/or Y directions to assist in the positioning of the layout of each cell on the substrate.

In an embodiment, the series of masks (MA1, MA2, MA3, MB1, MB2, MB3, MC1, MC2 and MC3) are projected on the substrate to form the patterns of the different cells (cell A, cell B and cell C) on the substrate. Subsequently, wiring of the patterns of the different cells is performed by projecting "a wiring pattern" on the substrate. This allows the possibility to increase the speed of projecting the different masks on the substrate while allowing for the flexibility of wiring the patterns of the masks in a desired way. The projection of the masks and the projection of the wiring pattern can be performed using different lithographic apparatuses or can be performed using a single lithographic apparatus. In the latter case, an integrated system may be provided that will allow an increased rate of device production. In an embodiment, a direct write lithographic system may be used to write the wiring pattern. A direct write lithographic system can be, for example, an e-beam lithographic system or a maskless lithographic system.

An exposed resist layer is developed and the end result is a substrate coated with a resist layer exhibiting a desired pattern which defines the geometries, features, lines and shapes of that layer. This process is repeated for each layer of the design. An array of devices may be obtained on the substrate. These devices may then be separated from one another by a technique such as dicing or sawing in the process of device fabrication 232. Individual devices may then be mounted on a carrier, connected to pins, etc.

Figure 3:
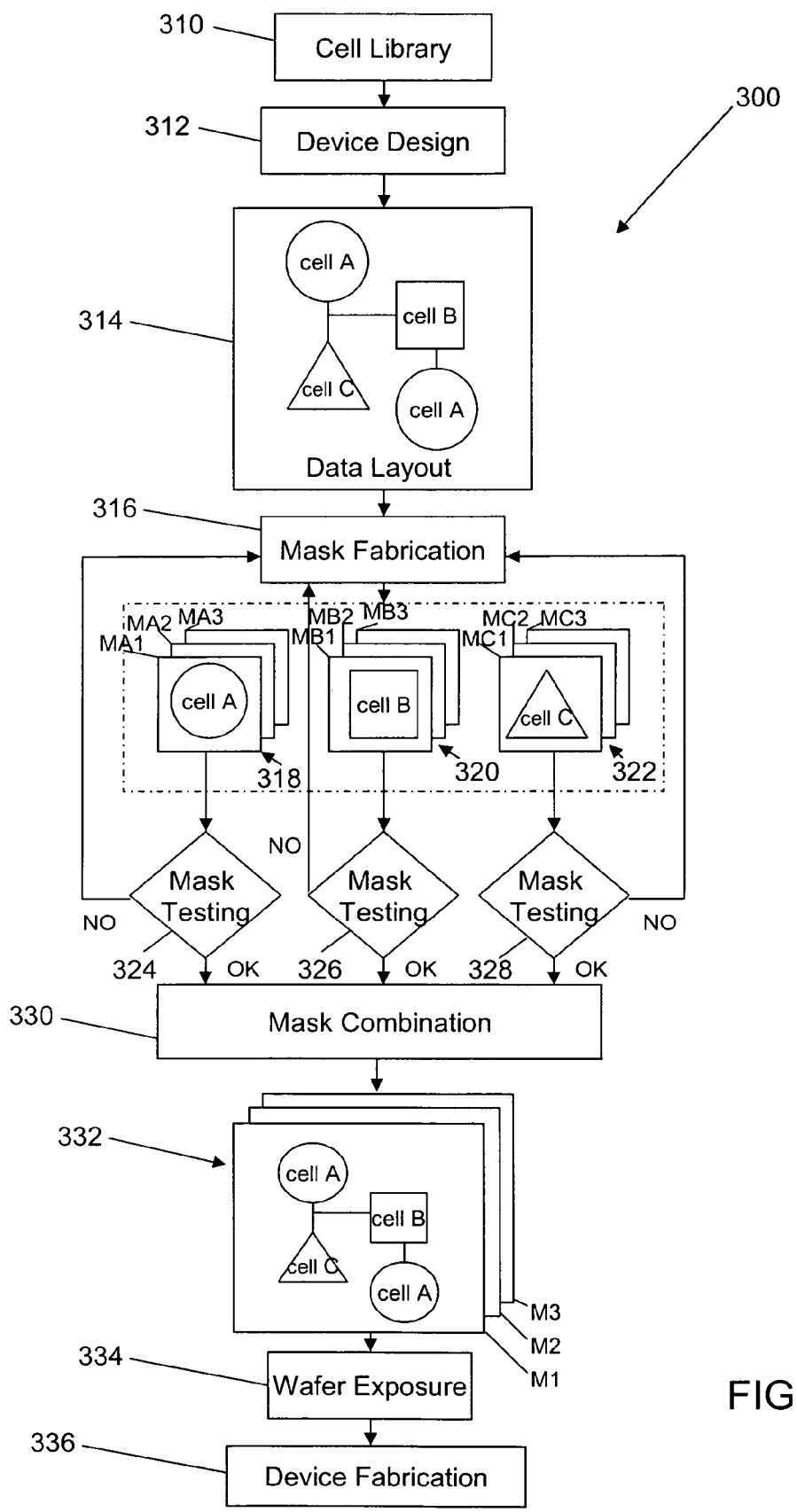
FIG. 3 is a flow chart showing the various steps in a process for the fabrication of a device according to another embodiment of the invention.

FIG. 3 is a flow chart 300 showing the various steps in a process for making a mask and fabricating a device according to an embodiment of the present invention. Similar to the process of FIG. 2, to design a desired device 312, selected cells are retrieved from a cell library 310 and a wiring is laid between the selected cells to form a data layout 314 in a computer. The cell library 310 is used repeatedly for designing several types of data layout. A same cell may be used for various device data layouts.

Similar to the embodiment shown in FIG. 2, a series of masks are created for each cell that is used in the device data layout. For example, a series of masks 318 corresponding to a series of layers for cell A (represented schematically by a circle) are created with mask fabrication process 316. A series of masks 320 corresponding to a series of layers for cell B (represented schematically by a square) are created using mask fabrication process 316. A series of masks 322 corresponding to a series of layers for cell C (represented schematically by a triangle) are created using mask fabrication process 316.

The one or more layers of a cell represent the various fabrication steps or levels that are sequenced to form three dimensional regions (semiconductors regions) and interconnects (metal lines) that form the cell "circuit." For example, the set of masks 318 comprises three masks MA1, MA2 and MA3. The three masks MA1, MA2 and MA3 are created based on the data layout of cell A. Similarly, the set of masks 320 comprises three masks MB1, MB2 and MB3. The three masks MB1, MB2 and MB3 are created based on the data layout of cell B. Similarly, the set of masks 322 comprise three masks MC1, MC2 and MC3. The three masks are created based on the data layout of cell C. Each mask MA1, MA2, MA3, MB1, MB2, MB3, MC1, MC2 and MC3 corresponds to an individual layer of the respective cell A, cell B or cell C.

As stated previously, the transfer of a cell layout to a physical template is performed by inputting the data representing the layout of each cell for that layer into a device such as an electron beam machine which writes the layout pattern of the cell into the corresponding mask material. Each mask comprises the geometric shapes which represent the desired cell pattern for its corresponding cell layer.

The set of masks 318, 320 and 322 of respectively cell A, cell B and cell C can be tested via, respectively, test procedures 324, 326 and 328, if needed. However, as explained previously if one or more of the masks 318, 320 and 322 were already fabricated, tested and certified, i.e., available "off the shelf" then the process of fabricating and/or testing those masks may be eliminated. This may translate into time saving as well as cost saving in the overall device fabrication process.

Following fabrication and optionally testing the masks of the cells (cell A, cell B and cell C), the cell masks can be combined in a mask combination process 330 into a single set of masks 332 to form a set of global masks embodying the data layout of the device.

For example, in the data layout of the device circuit shown in FIG. 3, cell A (represented by a circle), cell B (represented by a square), cell C (represented by a triangle) are connected to each other and cell B is connected to another cell A. In this simplified example, the set of masks 332 comprises three global masks M1, M2 and M3. Each global mask M1, M2, M3 correspond to a layer of the device circuit. Each layer of the device circuit is a combination of cell layers. Specifically, the global mask M1 is combination of masks MA1, MB1 and MC1, the global mask M2 is a combination of masks MA2, MB2 and MC2 and the global mask M3 is a combination of masks MA3, MB3 and MC3. Such combination may be done by projecting the appropriate cell-masks onto a mask blank.

The global masks M1, M2 and M3 are then used to optically project the layout onto a substrate coated with resist material in the exposure process 334. For each layer of the design layout, radiation is used to project the features in the global mask (M1, M2 or M3) corresponding to that layer. An exposed resist layer is then developed and the end result is a substrate coated with a resist layer exhibiting a desired pattern which defines the geometries, features, lines and shapes of that layer. This process is repeated for each layer of the design, i.e. for each global mask M1, M2 and M3. An array of devices may then be obtained on the substrate. These devices may then be separated from one another by a technique such as dicing or sawing in the process of device fabrication 336. Individual devices may then be mounted on a carrier, connected to pins, etc.

By combining the series of masks (MA1, MA2, MA3, MB1, MB2, MB3, MC1, MC2, MC3) corresponding to layers of the selected cells (cell A, cell B, cell C) onto a series of global masks (M1, M2, M3) embodying layers of the device, rapid creation of unique and highly complex global masks becomes possible. Specifically, by combining easier to create and easier to verify 16× masks (masks at magnification 16) to form more complex 4× global masks (masks at magnification 4 used, for example, in lithographic tools) or 1× global masks (masks without magnification used, for example, by direct write patterning tools) it becomes possible to create highly complicated 4× global masks or 1× global masks while errors during fabrication of the masks can be greatly minimized or substantially eliminated. As a result, the current mask patterning tools can be extended another generation without the need to recreate the larger resolution 16× mask pattern.

In a variant, to save mask exchanging in a lithographic apparatus at a cost of flexibility, a combination of mask patterns MA1, MB1, and MC1 may be formed on one mask for a first layer of the device. This first layer mask may be tested and then used to expose a substrate according to the data layout of the device or to form a global mask embodying the first layer of the device according to the data layout. Similarly, second and third layer masks can be created respectively from a combination of mask patterns MA2, MB2 and MC2 and of masks patterns MA3, MB3 and MC3.

While specific embodiments of the invention have been described above, it will be appreciated that the invention may be practiced otherwise than as described.

Furthermore, since numerous modifications and changes will readily occur to those of skill in the art, it is not desired to limit the invention to the exact construction and operation described herein. Moreover, the process, method and apparatus of the present invention, like related apparatus and processes used in the lithographic arts tend to be complex in nature and are often best practiced by empirically determining the appropriate values of the operating parameters or by conducting computer simulations to arrive at a best design for a given application. Accordingly, all suitable modifications and equivalents should be considered as falling within the spirit and scope of the invention.

What is claimed is:

1. A method of using a cell library to create a device, a design of the device including a data layout of the device formed from one or more selected cells from the cell library, comprising:
projecting a series of masks, each mask of the series corresponding to an individual layer of an individual one of the one or more selected cells, onto a substrate according to the data layout of the device.

2. The method according to claim 1, wherein a selected cell comprises an elementary cell.

3. The method according to claim 2, wherein the elementary cell includes a basic element of a layout of an integrated circuit device.

4. The method according to claim 1, wherein the selected cell comprises a block of elementary cells.

5. The method according to claim 1, wherein a selected cell comprises a portion of a data layout of an integrated circuit device.

6. The method according to claim 1, further comprising:
selecting one or more desired cells from a cell library; and
designing the device by wiring the one or more selected cells to form the data layout of the device.

7. The method according to claim 6, wherein designing the device is performed using a computer program.

8. The method according to claim 6, wherein designing the device comprises coupling selected cells to form the data layout of the device.

9. The method according to claim 1, further comprising:
fabricating the series of masks prior to projecting the series of masks onto the substrate.

10. The method according to claim 9, further comprising:
testing the series of masks prior to projecting the series of masks onto the substrate.

11. The method according to claim 1, wherein layers of a selected cell comprise fabrication steps sequenced to form a three dimensional region of the selected cell.

12. The method according to claim 1, wherein the series of masks include a first series of masks corresponding to layers of a first selected cell and a second series of masks corresponding to a second selected cell.

13. The method according to claim 12, wherein projecting a series of masks onto the substrate includes projecting the first series of masks corresponding to layers of the first selected cell onto a first location on the substrate and projecting the second series of masks corresponding to layers of the second selected cell onto a second location on the substrate.

14. The method according to claim 13, wherein the first location and the second location are spatially shifted from each other in accordance with the data layout of the device.

15. The method according to claim 12, wherein (i) the first series of masks comprises first and second masks, or (ii) the second series of masks comprises first and second masks, or (iii) the first series of masks comprises first and second masks and the second series of masks comprises first and second masks.

16. The method according to claim 15, wherein the first series of masks comprises first and second masks and the second series of masks comprises first and second masks and wherein the first and second masks of the first series of masks are created based on a data layout of the first cell and the first and second masks of the second series of masks are created based on a data layout of the second cell.

17. The method according to claim 12,
wherein the first series of masks comprises first and second masks and the second series of masks comprises first and second masks, and
wherein projecting a series of masks onto the substrate includes projecting the first mask of the first series of masks onto a first location on the substrate and projecting the first mask of the second series of masks onto a second location on the substrate to form at least in part a first layer of the device.

18. The method according to claim 17, wherein projecting a series of masks onto the substrate further includes projecting the second mask of the first series of masks onto the first location on the substrate and projecting the second mask of the second series of masks onto the second location on the substrate to form at least in part a second layer of the device.

19. The method according to claim 1, wherein the substrate is a semiconductor wafer.

20. The method according to claim 1, wherein projecting the series of masks onto a substrate is performed using a lithographic apparatus.

21. The method according to claim 1, further comprising:
projecting a wiring pattern to wire a layer of a first selected cell and a layer of a second selected cell.

22. The method according to claim 21, wherein projecting the wiring pattern is performed using a direct write lithography method.

23. A method of using a cell library to make a device, a design of the device including a data layout of the device formed from one or more selected cells from the cell library, comprising:
combining a series of masks, each mask of the series of masks corresponding to a layer of one of the one or more selected cells, into a series of global masks, each of the global masks of the series of global masks embodying a layer of the device according to the data layout of the device.

24. The method according to claim 23, wherein a selected cell comprises an elementary cell.

25. The method according to claim 24, wherein the elementary cell includes a basic element of a layout of an integrated circuit device.

26. The method according to claim 25, wherein a selected cell comprises a block of elementary cells.

27. The method according to claim 23, wherein a selected cell comprises a portion of a data layout of an integrated circuit device.

28. The method according to claim 23, further comprising:
selecting one or more desired cells from a cell library;
designing the device by wiring the one or more selected cells to form the data layout of the device.

29. The method according to claim 28, wherein designing the device is performed using a computer program.

30. The method according to claim 28, wherein designing the device comprises coupling selected cells to form the data layout of the device.

31. The method according to claim 23, further comprising:
fabricating the series of masks, prior to combining the series of masks into the series of global masks.

32. The method according to claim 31, further comprising:
testing the series of masks, prior to combining the series of masks into the series of global masks.

33. The method according to claim 23, wherein layers of a selected cell comprise fabrication steps sequenced to form a three dimensional region of the selected cell.

34. The method according to claim 23, wherein the series of masks include a first series of masks corresponding to layers of a first selected cell and a second series of masks corresponding to layers of a second selected cell, and the first series of masks comprises first and second masks and the second series of masks comprises first and second masks.

35. The method according to claim 34, wherein the series of global masks comprises first and second global masks.

36. The method according to claim 35, wherein combining the series of masks into a series of global masks includes combining the first mask of the first series of masks and the first mask of the second series of masks into the first global mask and combining the second mask of the first series of masks and the second mask of the second series of masks into the second global mask.

37. The method according to claim 36, further comprising:
projecting the first global mask and the second global mask of the series of global masks onto a substrate to form the device.

38. The method according to claim 23, further comprising:
projecting the series of global masks onto a substrate to form the device.

39. The method according to claim 38, wherein projecting is performed using a lithographic projection apparatus.

40. A lithographic apparatus comprising:
an illuminator adapted to condition a beam of radiation;
a support structure configured to hold a patterning device, the patterning device configured to impart the beam with a pattern in its cross-section and comprising a series of masks corresponding to layers of one or more selected cells, a data layout of a device formed from the one or more selected cells, wherein individual masks of the series correspond to individual layers of individual ones of the one or more selected cells;

a substrate table configured to hold a substrate;

a projection system adapted to project the patterned beam onto a target portion of the substrate, wherein, in use, the series of masks are projected onto the substrate according to the data layout.

41. The lithographic apparatus according to claim 40, wherein the one or more cells include a basic element of the data layout of the device.

42. The lithographic apparatus according to claim 41, wherein the device is an integrated circuit device.

43. The lithographic apparatus according to claim 40, wherein the one or more selected cells are retrieved from a cell library and the one or more selected cells are wired to each other to form the data layout of the device.

44. The lithographic apparatus according to claim 40, wherein the substrate is a mask blank.

45. The lithographic apparatus according to claim 40, wherein each mask in the series of masks is offset in at least one direction relative to another mask in the series of masks.

46. The lithographic apparatus according to claim 40, further comprising a direct write lithographic system configured to project a wiring pattern to wire a layer of a first selected cell and a layer of a second selected cell.

* * * * *